United States Patent
Kim

(10) Patent No.: US 10,607,704 B2
(45) Date of Patent: Mar. 31, 2020

(54) SEMICONDUCTOR MEMORY DEVICE AND METHOD OF OPERATING THE SAME

(71) Applicant: SK hynix Inc., Gyeonggi-do (KR)

(72) Inventor: Sang Sik Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/031,552

(22) Filed: Jul. 10, 2018

(65) Prior Publication Data

US 2019/0139612 A1 May 9, 2019

(30) Foreign Application Priority Data

Nov. 8, 2017 (KR) .................. 10-2017-0148119

(51) Int. Cl.
| | |
|---|---|
| *G11C 7/22* | (2006.01) |
| *G11C 16/26* | (2006.01) |
| *H01L 27/11582* | (2017.01) |
| *H01L 27/1157* | (2017.01) |
| *G11C 16/34* | (2006.01) |
| *H01L 27/11573* | (2017.01) |
| *G11C 29/50* | (2006.01) |
| *G11C 29/00* | (2006.01) |
| *G11C 16/04* | (2006.01) |
| *G11C 29/04* | (2006.01) |
| *G11C 16/08* | (2006.01) |
| *G11C 11/56* | (2006.01) |

(52) U.S. Cl.
CPC .......... *G11C 16/26* (2013.01); *G11C 16/0483* (2013.01); *G11C 16/3404* (2013.01); *G11C 16/3436* (2013.01); *G11C 16/3459* (2013.01); *G11C 29/04* (2013.01); *G11C 29/50004* (2013.01); *G11C 29/70* (2013.01); *H01L 27/1157* (2013.01); *H01L 27/11573* (2013.01); *H01L 27/11582* (2013.01); *G11C 11/5642* (2013.01); *G11C 16/08* (2013.01); *G11C 2029/5004* (2013.01)

(58) Field of Classification Search
CPC ..... G11C 16/26; G11C 16/08; G11C 16/3404; G11C 16/3436; H01L 27/1157; H01L 27/11573; H01L 27/11582
USPC ................................... 365/189.011
See application file for complete search history.

(56) References Cited

U.S. PATENT DOCUMENTS

2012/0327713 A1* 12/2012 Parat ..................... G11C 16/16
365/185.17

FOREIGN PATENT DOCUMENTS

KR     1020170069756     6/2017

* cited by examiner

*Primary Examiner* — Huang Hoang
(74) *Attorney, Agent, or Firm* — IP & T Group LLP

(57) ABSTRACT

Provided herein is a semiconductor memory device exhibiting improved operating speed and a method of operating the semiconductor memory device. The semiconductor memory device may include a memory cell array, a peripheral circuit, and a control logic. The memory cell array may include a plurality of memory blocks. The peripheral circuit may perform a read operation on the memory cell array. The control logic may control an operation of the peripheral circuit. The control logic may control the peripheral circuit to perform a repair column masking operation on a selected memory block of the plurality of memory blocks, perform a first test operation on first drain select transistors included in the selected memory block, perform the first test operation on second drain select transistors different from the first drain select transistors while a result of the repair column masking operation remains.

20 Claims, 14 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2017-0148119 filed on Nov. 8, 2017, the entire disclosure of which is incorporated herein by reference.

BACKGROUND

Field of Invention

Various embodiments of the present disclosure generally relate to an electronic device, and more particularly, to a semiconductor memory device and a method of operating the semiconductor memory device.

DESCRIPTION OF RELATED ART

Generally, a memory device may have a two-dimensional structure in which cell strings are horizontally arranged on a semiconductor substrate, or a three-dimensional structure in which cell strings are vertically stacked on a semiconductor substrate. The three-dimensional memory device overcomes a limitation in the degree of integration of the two-dimensional memory device and may include a plurality of memory cells which are vertically stacked on a semiconductor substrate.

SUMMARY

Various embodiments of the present disclosure are directed to a semiconductor memory device having an improved operating speed.

Various embodiments of the present disclosure are directed to a method of operating a semiconductor memory device at an improved speed.

An embodiment of the present disclosure provides a semiconductor memory device including a memory cell array, a peripheral circuit, and a control logic. The memory cell array may include a plurality of memory blocks. The peripheral circuit may perform a read operation on the memory cell array. The control logic may control an operation of the peripheral circuit. The control logic may control the peripheral circuit to perform a repair column masking operation on a selected memory block of the plurality of memory blocks, perform a first test operation on first drain select transistors included in the selected memory block, perform the first test operation on second drain select transistors different from the first drain select transistors while a result of the repair column masking operation remains.

An embodiment of the present disclosure may provide for a method for operating a semiconductor memory device, including: performing a repair column masking operation of a selected memory region; testing a threshold voltage distribution of first drain select transistors of the selected memory region; and testing a threshold voltage distribution of second drain select transistors included in the selected memory regions, wherein a result of the repair column masking operation remains.

An embodiment of the present disclosure may provide for a method for operating a semiconductor memory device, including: performing a repair column masking operation of a selected memory block; performing a first test operation on a plurality of drain select transistors included in the selected memory block; and performing a second test operation on the plurality of drain select transistors while a result of the repair column masking operation remains.

These and other features and advantages of the present invention will become apparent to those with ordinary skill in the art to which the present invention belongs from the following description in conjunction with the accompanying drawings.

DETAILED DESCRIPTION

Figure 1:
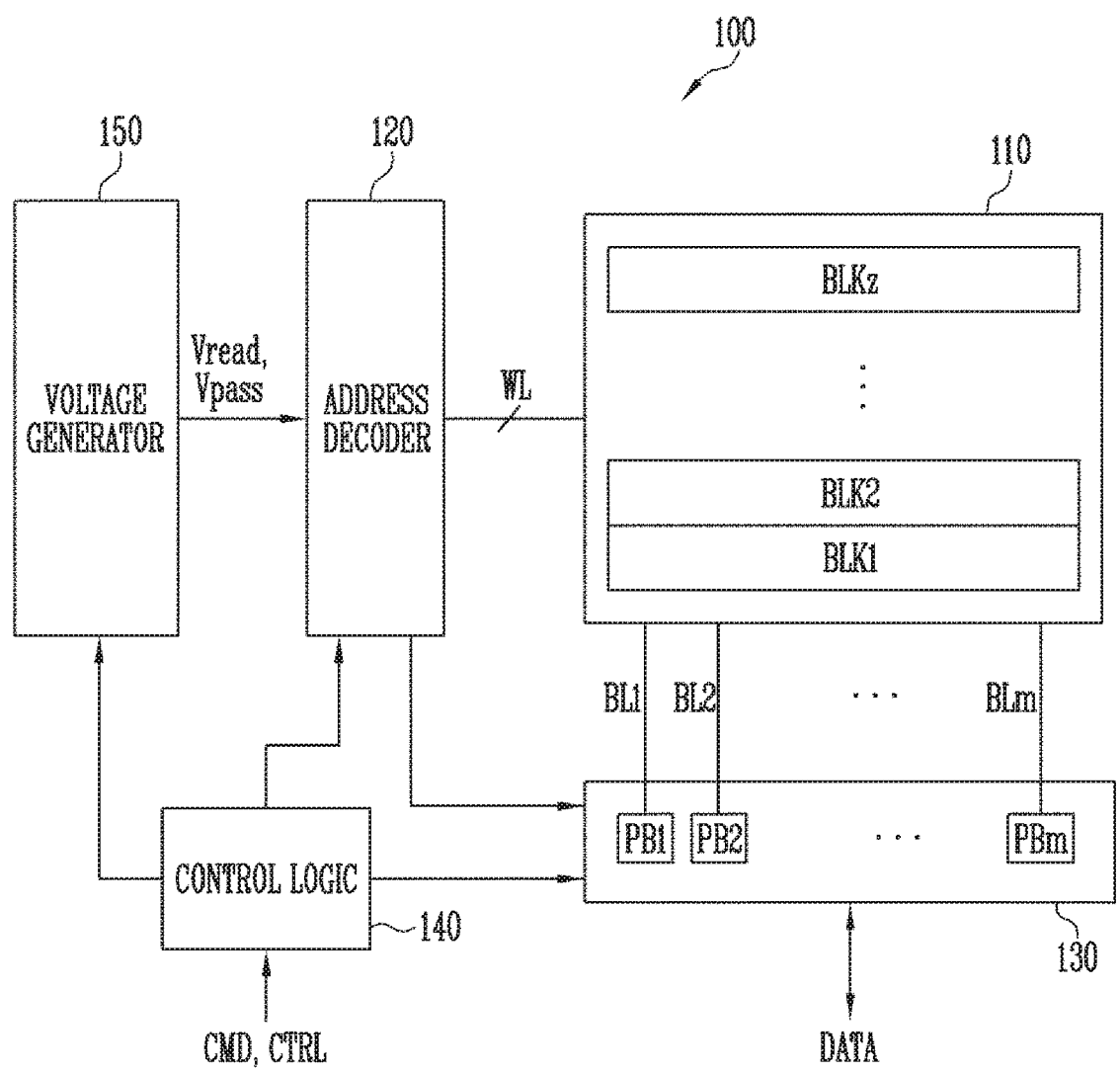
FIG. 1 is a block diagram illustrating a semiconductor memory device, in accordance with an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a block diagram illustrating a semiconductor memory device 100, in accordance with an embodiment of the present disclosure.

Referring to FIG. 1, the semiconductor memory device 100 may include a memory cell array 110, an address decoder 120, a read/write circuit 130, a control logic 140, and a voltage generator 150.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read/write circuit 130 through bit lines BL1 to BLm. Each of the memory blocks BLK1 to BLKz may include a plurality of memory cells. In an embodiment, the plurality of memory cells may be nonvolatile memory cells and be formed of nonvolatile memory cells having a vertical channel structure. The memory cell array 110 may be formed of a memory cell array having a two-dimensional structure. In an embodiment, the memory cell array 110 may be formed of a memory cell array having a three-dimensional structure. Each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell, which stores 3-bit data. In an embodiment, each of the memory cells included in the memory cell array 110 may be a quad-level cell, which stores 4-bit data. In various embodiments, the memory cell array 110 may include a plurality of memory cells each of which stores 5 or more bits of data.

The address decoder 120, the read/write circuit 130, the control logic 140, and the voltage generator 150 are operated as peripheral circuits for driving the memory cell array 110. The address decoder 120 may be coupled to the memory cell array 110 through the word lines WL. The address decoder 120 may operate under control of the control logic 140. The address decoder 120 may receive addresses through an input/output buffer (not shown) provided in the semiconductor memory device 100.

The address decoder 120 may decode a block address among the received addresses. The address decoder 120 may select at least one memory block based on the decoded block address. When a read voltage application operation is performed during a read operation, the address decoder 120 may apply a read voltage Vread generated from the voltage generator 150, to a selected word line of a selected memory block and apply a pass voltage Vpass to the unselected word lines of the selected memory block. During a program verify operation, the address decoder 120 may apply a verify voltage generated from the voltage generator 150, to a selected word line of a selected memory block, and apply a pass voltage Vpass to the unselected word lines of the selected memory block.

The address decoder 120 may decode a column address among the received addresses. The address decoder 120 may transmit the decoded to column address to the read/write circuit 130.

The read or program operation of the semiconductor memory device 100 may be performed on a page basis. Addresses received in a request for a read or program operation may include a block address, a row address and a column address. The address decoder 120 may select one memory block and one word line in response to a block address and a row address. The column address may be decoded by the address decoder 120 and provided to the read/write circuit 130.

The address decoder 120 may include a block decoder, a row decoder, a column decoder, an address buffer, etc.

The read/write circuit 130 may include a plurality of page buffers PB1 to PBm. The read/write circuit 130 may be operated as a read circuit during a read operation of the memory cell array 110 and as a write circuit during a write operation. The plurality of page buffers PB1 to PBm may be coupled to the memory cell array 110 through the bit lines BL1 to BLm. During a read operation or a program verify operation, for sensing the threshold voltages of the memory cells, the page buffers PB1 to PBm may continuously supply sensing current to the bit lines coupled to the memory cells, and each page buffer through a sensing node may sense a change in the amount of flowing current depending on a program state of a corresponding memory cell and latch it as sensing data. The read/write circuit 130 is operated in response to page buffer control signals transmitted from the control logic 140.

During a read operation, the read/write circuit 130 may sense data of the memory cells (read-out data) and temporarily store the read-out data, and then output the read-out data DATA to the input/output buffer (not shown) of the semiconductor memory device 100. In an embodiment, the read/write circuit 130 may include a column select circuit or the like as well as the page buffers (or page registers).

The control logic 140 may be coupled to the address decoder 120, the read/write circuit 130, and the voltage generator 150. The control logic 140 may receive a command CMD and a control signal CTRL through the input/output buffer (not shown) of the semiconductor memory device 100. The control logic 140 may control the overall operation of the semiconductor memory device 100 in response to the control signal CTRL.

The control logic 140 may output a control signal for controlling the sensing node precharge potential levels of the plurality of page buffers PB1 to PBm. The control logic 140 may control the read/write circuit 130 to perform a read operation of the memory cell array 110.

During a program operation, the control logic 140 may control the peripheral circuits to perform a least significant bit (LSB) program loop for storing LSB data and a most significant bit (MSB) program loop for storing MSB data. As a result of performing the MSB program loop, the states of the threshold voltages of the memory cells coupled to the selected word line may be divided into an erased state and first to third programmed states. During the MSB program loop, the control logic 140 may control the peripheral circuits to program flag data indicating that data programmed according to the program operation is the MSB data, after a verify operation has been performed on at least one of the first to third programmed states.

For example, the control logic may control the peripheral circuits to program the flag data after a verify operation has been performed on the first programmed state. In an embodiment, the control logic may control the peripheral circuits to program the flag data after a verify operation has been performed on the third programmed state.

The voltage generator 150 may generate a read voltage Vread and a pass voltage Vpass in response to a control signal output from the control logic 140 during a read operation. The voltage generator 150 may include, so as to generate a plurality of voltages having various voltage levels, a plurality of pumping capacitors configured to receive an internal source voltage, and may generate a plurality of voltages by selectively enabling the plurality of pumping capacitors under control of the control logic 140.

Figure 2:
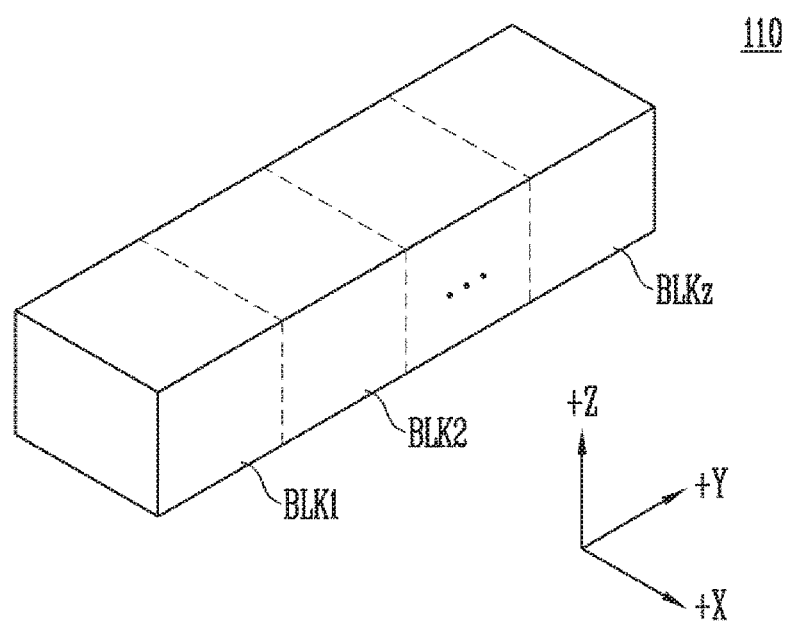
FIG. 2 is a diagram illustrating an example of a memory cell array of FIG. 1.

FIG. 2 is a diagram illustrating an example of the memory cell array 110 of FIG. 1.

Referring to FIG. 2, the memory cell array 110 includes the plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 3 and 4.

Figure 3:
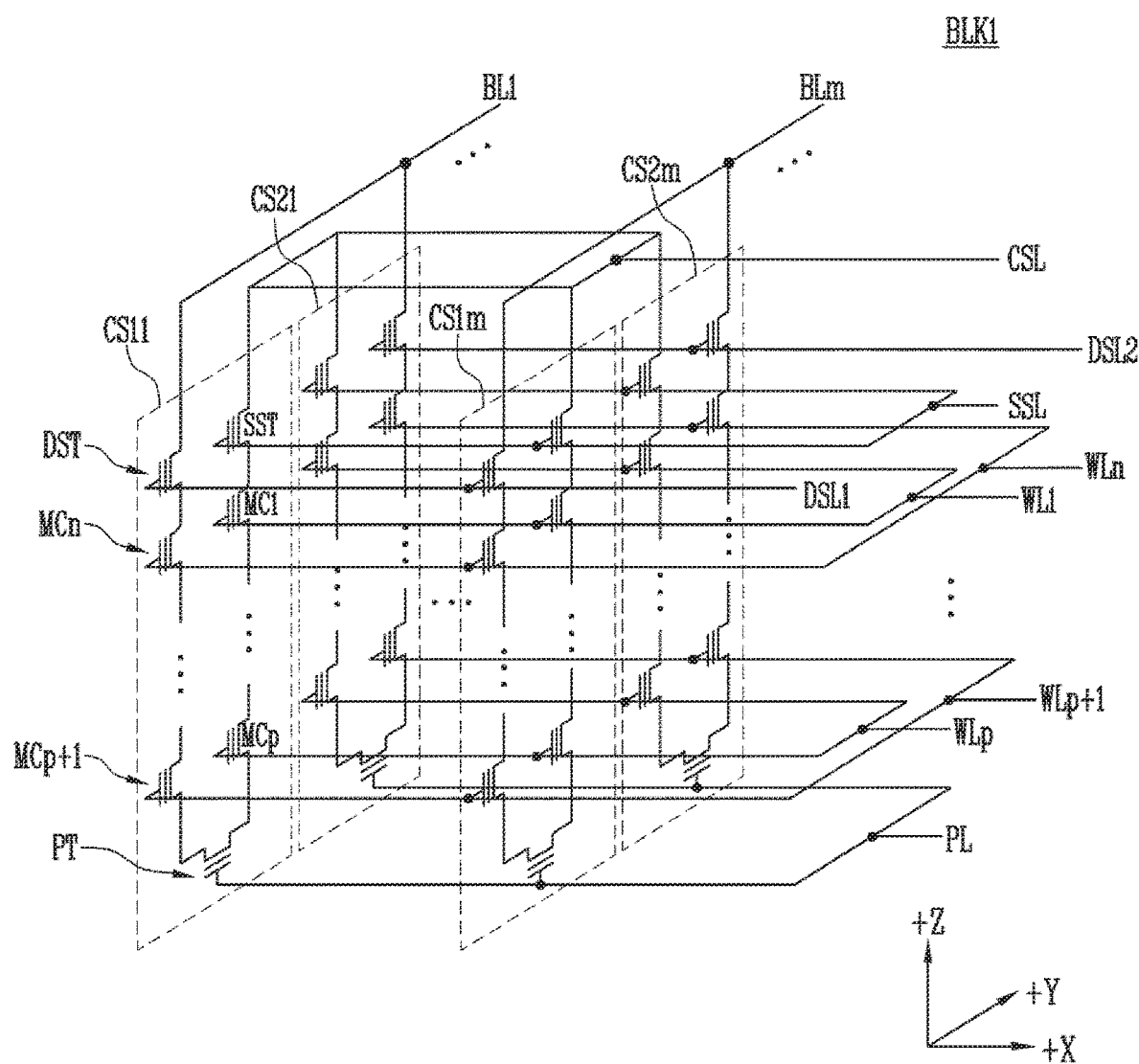
FIG. 3 is a circuit diagram illustrating an example of a memory block of the memory cell array of FIG. 2.

FIG. 3 is a circuit diagram illustrating an example of block BLK1 of the memory blocks BLK1 to BLKz of FIG. 2. The memory blocks BLK1 to BLKz may be identical.

Referring to FIG. 3, the first memory block BLK1 may include a plurality of cell strings CS11 to CS1*m* and CS21 to CS2*m*. In the first memory block BLK1, m cell strings are arranged in a row direction (i.e. a positive (+) X direction). The m cell strings arranged in the row direction may be respectively coupled to the first to m-th bit lines BL1 to BLm. q (q is a natural number) cell strings may be arranged in a column direction (i.e., a positive (+) Y direction). In FIG. 3, for the sake of explanation, there are illustrated only two cell strings arranged in the column direction.

Each of the cell strings CS11 to CS1*m* and CS21 to CS2*m* may be formed in a 'U' shape and may include a pipe transistor PT, memory cells MC1 to MCn, a source select transistor SST, and a drain select transistor DST which are stacked on a substrate (not shown) provided in a lower portion of the memory block BLK1.

The select transistors SST and DST and the memory cells MC1 to MCn may have structures similar to each other. For example, each of the select transistors SST and DST and the memory cells MC1 to MCn may include a channel layer, a tunneling insulating layer, a charge storage layer, and a blocking insulating layer coupled to a corresponding row line.

The source select transistor SST of each cell string may be coupled between the common source line CSL and the memory cells MC1 to MCp. A gate of the source select transistor SST may be coupled to a source select line SSL.

The first to n-th memory cells MC1 to MCn in each cell string may be coupled between the source select transistor SST and the drain select transistor DST.

The first to n-th memory cells MC1 to MCn are divided into first to p-th memory cells MC1 to MCp and p+1-th to n-th memory cells MCp+1 to MCn. The first to p-th memory cells MC1 to MCp and the p+1-th to n-th memory cells MCp+1 to MCn may be coupled to each other through the pipe transistor PT. The first to p-th memory cells MC1 to MCp are successively arranged in a direction opposite to a positive (+) Z direction and may be coupled in series between the source select transistor SST and the pipe transistor PT. The p+1-th to n-th memory cells MCp+1 to MCn are successively arranged in the +Z direction and may be coupled in series between the pipe transistor PT and the drain select transistor DST. Gates of the first to n-th memory cells MC1 to MCn may be respectively coupled to first to n-th word lines WL1 to WLn.

A gate of the pipe transistor PT of each cell string may be coupled to a pipeline PL.

The drain select transistor DST of each cell string may be coupled between the corresponding bit line and the memory cells MCp+1 to MCn. Drain select transistors DST of the cell strings CS11 to CS1*m* in a first row may be coupled to a first drain select line DSL1. Drain select transistors DST of the cell strings CS21 to CS2*m* in a second row may be coupled to a second drain select line DSL2.

In other words, cell strings (e.g., CS11 to CS1m) arranged in the same row (+X direction) may be coupled to the same drain select line (e.g., DSL1) through the corresponding drain select transistors. Cell strings (e.g., CS11 and CS21) arranged in different rows may be coupled to different drain select lines DSL1 and DSL2.

Cell strings coupled in common to each bit line may form a single column. For example, the cell strings CS11 and CS21 that may be coupled in common to the first bit line BL1 correspond to a first column. Likewise, cell strings CS1m and CS2m coupled in common to the m-th bit line BLm may correspond to an m-th column. Referring to FIG. 3, the memory block BLK1 includes m columns, and each column may include two cell strings.

Cell strings coupled to each drain select line may form a single row. For example, the cell strings CS11 to CS1m coupled to the first drain select line DSL1 correspond to a first row. The cell strings CS21 to CS2m coupled to the second drain select line DSL2 correspond to a second row. As shown in FIG. 3, the memory block BLK1 includes two rows, and each row includes m cell strings.

Figure 4:
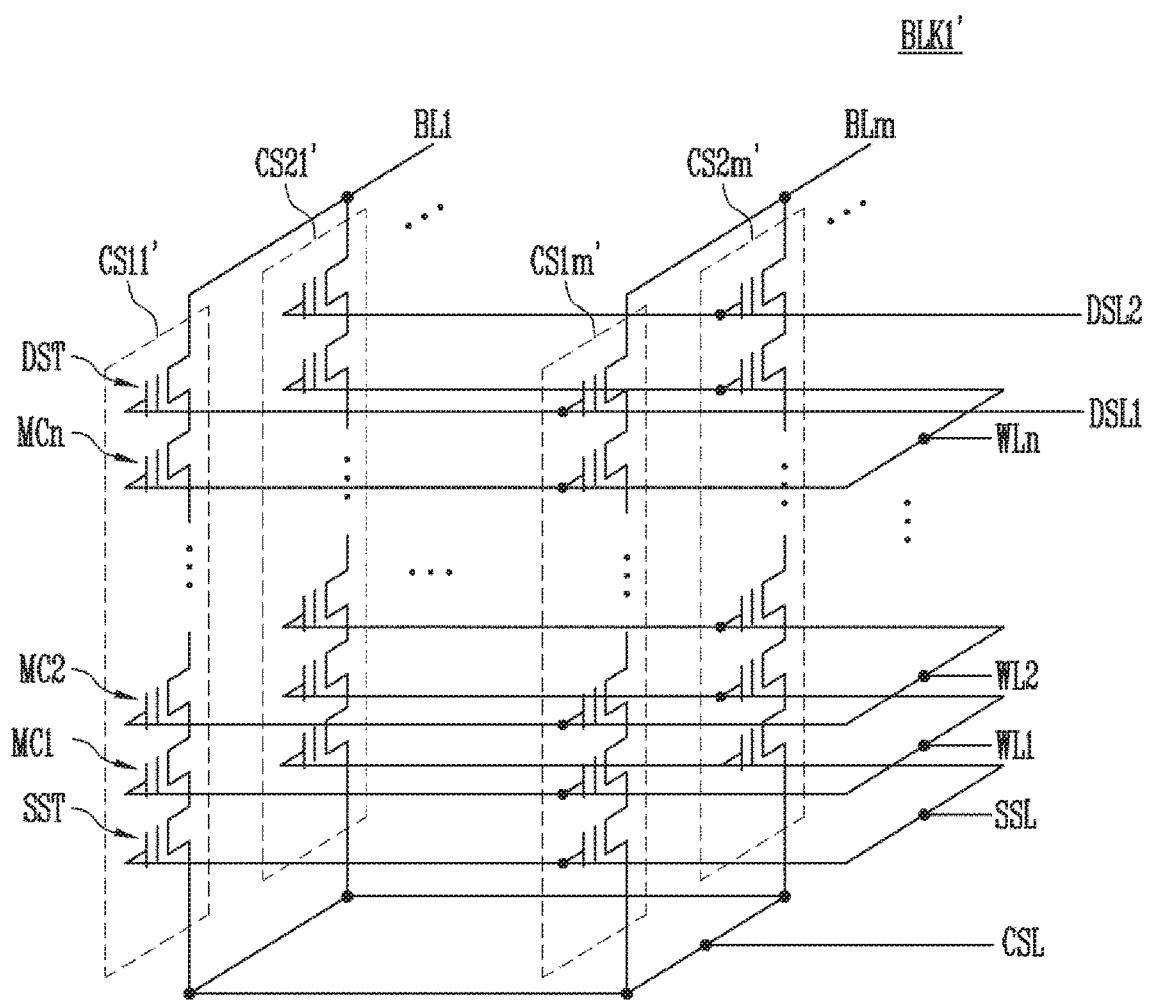
FIG. 4 is a circuit diagram illustrating another example of a memory block of the memory cell array of FIG. 2.
Figure 4:
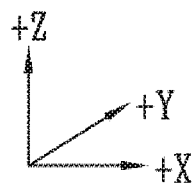

FIG. 4 is a circuit diagram illustrating an example of memory block BLK1, designated as BLK1' and which may be identical to any of the memory blocks BLK1 to BLKz of FIG. 2.

Referring to FIG. 4, the first memory block BLK1' may include a plurality of cell strings CS11' to CS1m' and CS21' to CS2m'. In the first memory block BLK1', m cell strings are arranged in a row direction (i.e. a positive (+) X direction). The m cell strings arranged in the row direction may be respectively coupled to the first to m-th bit lines BL1 to BLm. q (q is a natural number) cell strings may be arranged in a column direction (i.e., a positive (+) Y direction). In FIG. 4, for the sake of explanation, there are illustrated only two cell strings arranged in the column direction.

Each of the cell strings CS11' to CS1m' and CS21' to CS2m' extends in a positive (+) Z direction. Each of the cell strings CS11' to CS1m' and CS21' to CS2m' may include a source select transistor SST, first to n-th memory cells MC1 to MCn, and a drain select transistor DST which are stacked on a substrate (not shown) provided in a lower portion of the memory block BLK1'.

The source select transistor SST of each cell string may be coupled in common to the common source line CSL. The source select transistor SST of each cell string may be coupled between the common source line CSL and the memory cells MC1 to MCn. A gate of the source select transistor SST of each cell string may be coupled to a source select line SSL.

The first to n-th memory cells MC1 to MCn in each cell string may be coupled in series between the source select transistor SST and the drain select transistor DST. Memory cells disposed at the same height may be coupled to the same word line. The first to n-th memory cells MC1 to MCn may be respectively coupled to first to n-th word lines WL1 to WLn.

The drain select transistor DST of each cell string may be coupled to between the corresponding bit line and the memory cells MC1 to MCn. The drain select transistors of the cell strings arranged in the same row direction (+X direction) may be coupled to the same drain select line. Drain select transistors DST of the cell strings CS11' to CS1m' in a first row may be coupled to a first drain select line DSL1. Drain select transistors DST of the cell strings CS21' to CS2m' in a second row may be coupled to a second drain select line DSL2.

Cell strings coupled in common to each bit line may form a single column. For example, the cell strings CS11' and CS21' that are coupled in common to the first bit line BL1 correspond to a first column. Likewise, cell strings CS1m' and CS2m' coupled in common to the m-th bit line BLm may correspond to an m-th column. Referring to FIG. 4, the memory block BLK1' includes m columns, and each column may include two cell strings.

Strings coupled to each drain select line may form a single row. For example, the cell strings CS11' to CS1m' coupled to the first drain select line DSL1 correspond to a first row. The cell strings CS21' to CS2m' coupled to the second drain select line DSL2 correspond to a second row. As shown in FIG. 4, the memory block BLK1' includes two rows, and each row includes m cell strings.

Consequentially, the memory block BLK1' of FIG. 4 has an equivalent circuit similar to that of the memory block BLK1 of FIG. 3 except that a pipe select transistor PT is excluded from each cell string.

In FIG. 4, the first to m-th cell strings CS11' to CS1m' or CS21' to CS2m' arranged in the row direction may be respectively coupled to the first to m-th bit lines BL1 to BLm. In an embodiment, even bit lines and odd bit lines may be provided in lieu of the first to m-th bit lines BL1 to BLm. It will be understood that even number-th cell strings among the cell strings CS11' to CS1m' or CS21' to CS2m' arranged in the row direction may be coupled to the respective even bit lines, and odd number-th cell strings among the cell strings CS11' to CS1m' or CS21' to CS2m' arranged in the row direction may be coupled to the respective odd bit lines.

Figure 5A:
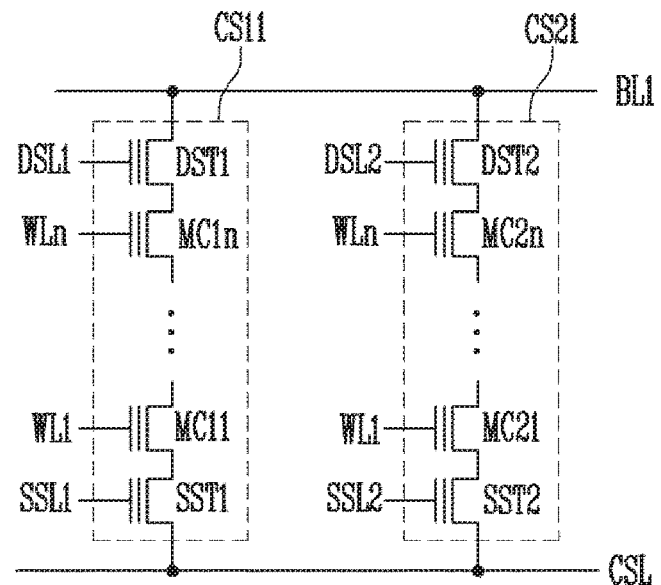
FIG. 5A is an exemplary circuit diagram illustrating an example of one column included in a memory block.

FIG. 5A is an exemplary circuit diagram illustrating one example of one of the columns included in a memory block, in accordance to an embodiment of the present disclosure. In FIG. 5A, the illustration of the pipe select transistor PT has been omitted. Therefore, substantially, FIG. 5A is also a circuit diagram illustrating one column of the memory block shown in FIG. 4.

Referring to FIG. 5A, the column may include a plurality of cell strings CS11 and CS21 coupled to a bit line BL1. The bit line BL1 may correspond to the bit line BL1 provided in the memory block BLK1 illustrated in FIG. 3. The two cell strings CS11 and CS21 included in the column of FIG. 5A may correspond to the cell strings CS11 and CS21 coupled to the bit line BL1 of FIG. 3. Each of the cell strings CS11 and CS21 included in the column may include a plurality of memory cells and a plurality of select transistors.

For example, the cell string CS11 may include a drain select transistor DST1, n memory cells MC11 to MC1n, and a source select transistor SST1. The cell string CS21 may include a drain select transistor DST2, n memory cells MC21 to MC2n, and a source select transistor SST2. Each of the drain select transistors DST1 and DST2 and the source select transistors SST1 and SST2 may be embodied using a cell type transistor including a charge storage layer in the same manner as that of the memory cells MC11 to MC1n and MC21 to MC2n. Therefore, a program operation for increasing the threshold voltages of the drain select transistors DST1 and DST2 and the source select transistors SST1 and SST2 may be performed.

However, the foregoing illustration is only one example. Each of the source select transistors SST1 and SST2 may be embodied using a typical transistor which does not include a charge storage layer. In this case, a program operation may not be performed on the source select transistors SST1 and SST2.

Figure 5B:
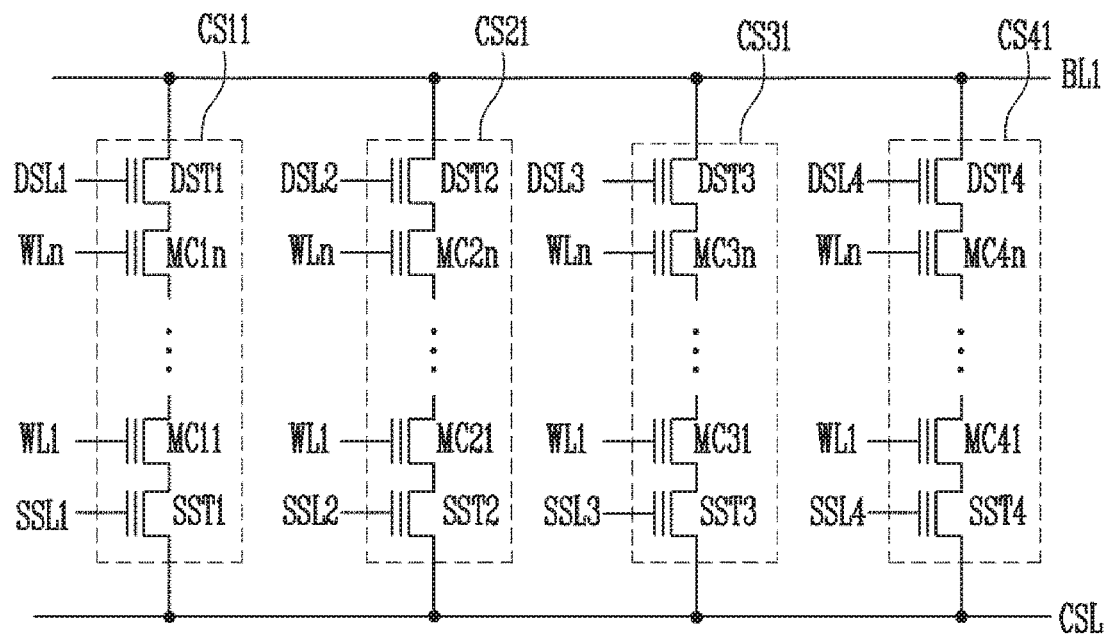
FIG. 5B is an exemplary circuit diagram illustrating another example of one column included in a memory block.

FIG. 5B is an exemplary circuit diagram illustrating another example of one of the columns included in a memory block, in accordance to an embodiment of the present disclosure. Referring to FIG. 5B, the column may include four cell strings CS11, CS21, CS31, and CS41. The cell string CS11 may include a drain select transistor DST1, n memory cells MC11 to MC1n, and a source select transistor SST1. The cell string CS21 may include a drain select transistor DST2, n memory cells MC21 to MC2n, and a source select transistor SST2. The cell string CS31 may include a drain select transistor DST3, n memory cells MC31 to MC3n, and a source select transistor SST3. The cell string CS41 may include a drain select transistor DST4, n memory cells MC41 to MC4n, and a source select transistor SST4.

Referring to FIGS. 5A and 5B together, it can be seen that a column of the memory cell array may be configured to have two cell strings as illustrated in FIG. 5A, or four cell strings as illustrated in FIG. 5B. Hence, a person skilled in the art should understand that, likewise, the number of cell strings included in each column of the memory block may be changed to include any desired number of cell strings as may be needed by design.

Figure 6:
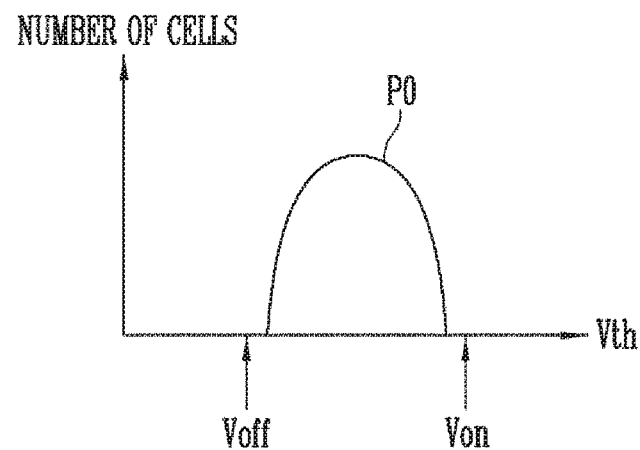
FIG. 6 is a diagram illustrating an example of a threshold voltage distribution of drain select transistors.

FIG. 6 is a diagram illustrating an example of a threshold voltage distribution of drain select transistors. Referring to FIG. 6, there is illustrated a distribution P0 of threshold voltages Vth of drain select transistors in a memory block BLK1. When a turn-off voltage Voff is applied to a gate electrode of the drain select transistor, the drain select transistor is turned off because the turn-off voltage Voff is less than the threshold voltage of the drain select transistor. When a turn-on voltage Von is applied to the gate electrode of the drain select transistor, the drain select transistor is turned on because the turn-on voltage Von is greater than the threshold voltage of the drain select transistor.

Figure 7:
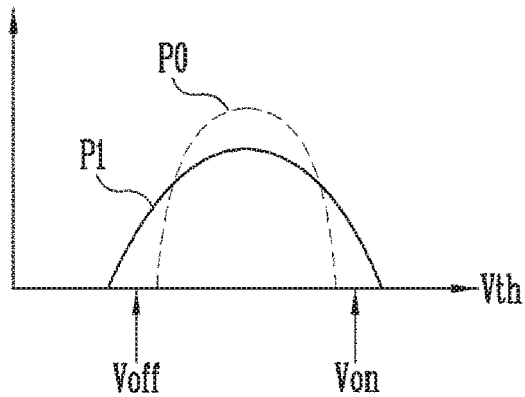
FIG. 7 is a diagram illustrating an effect resulting from a change in threshold voltage distribution of the drain select transistors.

FIG. 7 is a diagram illustrating an effect resulting from a change in threshold voltage distribution of the drain select transistors. Referring to FIG. 7, there is illustrated a change of the threshold voltage distribution from a distribution P0 to a distribution P1 due to repetitive use of the drain select transistor. As the threshold voltage of the drain select transistor is changed to the distribution P1, there may be a drain select transistor which remains turned on even when the turn-off voltage Voff is applied thereto. Furthermore, as the threshold voltage of the drain select transistor is changed to the distribution P1, there may be a drain select transistor which remains turned off even when the turn-on voltage Von is applied thereto. The distorted distribution P1 of the drain select transistor may cause an error in an operation of storing data to a corresponding cell string, or reading data from the cell string, or erasing data from the cell string. To prevent the foregoing malfunction, it is important to sense the distorted threshold voltage distribution of the drain select transistors which may cause the malfunction or error.

Figure 8A:
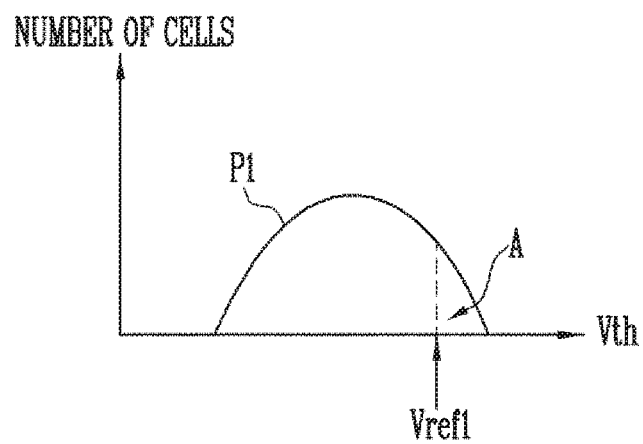
FIG. 8A is a diagram illustrating a right test operation of the threshold voltage distribution of the drain select transistors.

FIG. 8A is a diagram illustrating an a right test operation of the threshold voltage distribution of the drain select transistors.

Referring to FIG. 8A, there is illustrated an example in which a first reference voltage Vref1 is applied to the gate electrodes of the drain select transistors so as to detect a drain select transistor which remains turned off even when the turn-on voltage Von is applied thereto. In an embodiment, the first reference voltage Vref1 may be a voltage having the same level as that of the turn-on voltage Von shown in FIGS. 6 and 7. In an embodiment, to secure a margin of a turn-on operation, the first reference voltage Vref1 may be a voltage having a level greater than that of the turn-on voltage Von shown in FIGS. 6 and 7 by a predetermined level.

Referring to FIGS. 3 and 8A together, the first reference voltage Vref1 is applied to a drain select line coupled to drain select transistors provided on a selected row for detecting whether the drain select transistors have threshold voltages (denoted with "A" in FIG. 8A) which are higher than the first reference voltage Vref1. For example, to perform a right test on the drain select transistors included in the first row of FIG. 3, the first reference voltage Vref1 is applied to the first drain select line DSL1. The turn-off voltage Voff or a voltage lower than the turn-off voltage Voff is applied to the second drain select line DSL2 to prevent current from being supplied to the cell strings included in the second row.

The first reference voltage Vref1 may be referred to as "right reference voltage" because it is used to perform the right test on the drain select transistors.

When the first reference voltage Vref1, i.e., the right reference voltage, is applied to the first drain select line DSL1, the first reference voltage Vref1 is applied to the gate electrode of each of the drain select transistors included in the cell strings CS11 to CS1m.

On the other hand, a pass voltage is applied to the first to n-th word lines WL1 to WLn. Hence, all of the memory cells included in the cell strings CS11 to CS1m may be turned on. To turn on the source select transistors SST included in the cell strings CS11 to CS1m, a voltage higher than the threshold voltages of the source select transistors SST is applied to the source select line SSL.

During the foregoing process, a drain select transistor having a threshold voltage (denoted with "A" in FIG. 8A) higher than the first reference voltage Vref1 is turned off. Consequently, a defective drain select transistor can be detected as a result of a sensing operation in the page buffer.

After the right test has been performed on the drain select transistors included in the first row through the above-mentioned process, the right test is performed on drain select transistors included in the second row through a similar process. During this process, the turn-off voltage Voff or a voltage lower than the turn-off voltage Voff is applied to the first drain select linen DSL1, and the first reference voltage Vref1 is applied to the second drain select line DSL2.

In summary, the right test is performed on the drain select transistor included in the first row, and the right test is thereafter performed on the drain select transistors included in the second row. In the embodiment shown in FIG. 5B, with regard to first to fourth rows, right tests may be sequentially performed on drain select transistors included in respective rows.

Figure 8B:
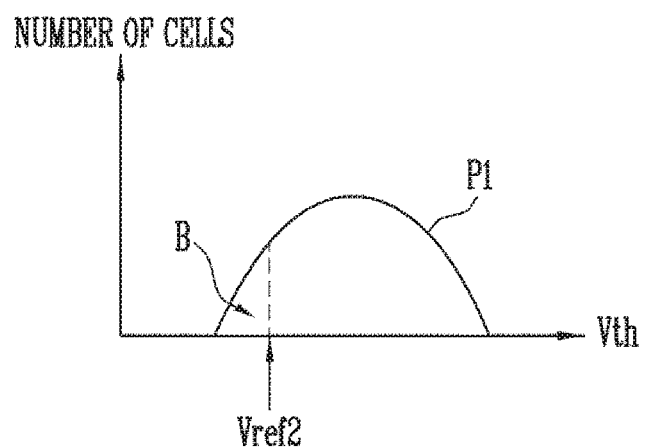
FIG. 8B is a diagram illustrating a left test operation of the threshold voltage distribution of the drain select transistors.

FIG. 8B is a diagram illustrating a left test operation of the threshold voltage distribution of drain select transistors.

Referring to FIG. 8B, there is illustrated an example in which a second reference voltage Vref2 is applied to the gate electrodes of the drain select transistors so as to detect a drain select transistor which remains turned on even when the turn-off voltage Voff is applied thereto. In an embodiment, the second reference voltage Vref2 may be a voltage having the same level as that of the turn-off voltage Voff shown in FIGS. 6 and 7. In an embodiment, to secure a margin of a turn-off operation, the second reference voltage Vref2 may be a voltage having a level less than that of the turn-off voltage Voff shown in FIGS. 6 and 7 by a predetermined level.

Referring to FIGS. 3 and 8B together, to detect drain select transistors having threshold voltages (denoted with "B" in FIG. 8B) which are lower than the second reference voltage Vref2, the second reference voltage Vref2 is applied to a drain select line coupled to drain select transistors provided on a selected row. For example, to perform a left test on the drain select transistors included in the first row of FIG. 3, the second reference voltage Vref2 is applied to the first drain select line DSL1. The turn-off voltage Voff or a voltage lower than turn-off voltage Voff is applied to the second drain select line DSL2 to prevent current from being supplied to the cell strings included in the second row.

When the second reference voltage Vref2 is applied to the first drain select line DSL1, the second reference voltage Vref2 is applied to the gate electrode of each of the drain select transistors included in the cell strings CS11 to CS1m.

On the other hand, a pass voltage is applied to the first to n-th word lines WL1 to WLn. Hence, all of the memory cells included in the cell strings CS11 to CS1m may be turned on. To turn on the source select transistors SST included in the cell strings CS11 to CS1m, a voltage higher than the threshold voltages of the source select transistors SST is applied to the source select line SSL.

During the foregoing process, a drain select transistor having a threshold voltage (denoted with "B" in FIG. 8B) lower than the second reference voltage Vref2 is turned on. Consequently, a defective drain select transistor can be detected as a result of a sensing operation in the page buffer.

After the left test has been performed on the drain select transistors included in the first row through the above-mentioned process, a left test is performed on drain select transistors included in the second row through a similar process. During this process, the turn-off voltage Voff or a voltage lower than the turn-off voltage Voff is applied to the first drain select linen DSL1, and the second reference voltage Vref2 is applied to the second drain select line DSL2.

In summary, a left test is performed on the drain select transistor included in the first row, and a left test is thereafter performed on the drain select transistors included in the second row. In the embodiment shown in FIG. 5B, with regard to first to fourth rows, left tests may be sequentially performed on drain select transistors included in respective rows.

Figure 9:
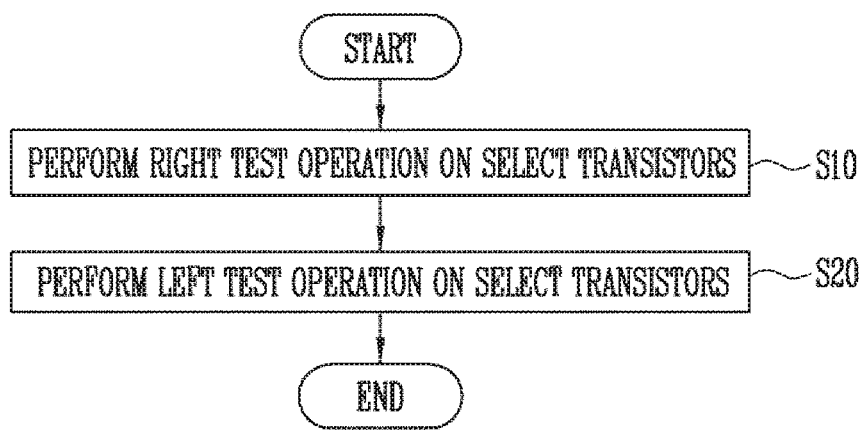
FIG. 9 is a flowchart of a method of testing select transistors.

FIG. 9 is a flowchart of a method of testing select transistors.

Referring to FIG. 9, a right test operation is performed on select transistors at step S10, and a left test operation is performed on the select transistors at step S20. As shown in FIG. 9, the right test operation is performed as a first test on the select transistors, and the second test operation is thereafter performed as a second test. Here, the first test is not limited to the right test operation, and the second test is not limited to the left test operation. As will be described with reference to FIG. 17, the left test operation may be performed as the first test, and the right test operation may be performed thereafter as the second test.

As described with reference to FIG. 8A, the right test is performed on the drain select transistors included in the memory block. As described with reference to FIG. 8B, the left test is performed on the drain select transistors included in the memory block. Step S10 may correspond to a process of performing the right test on the drain select transistors included in the memory block. Step S20 may correspond to a process of performing the left test on the drain select transistors included in the memory block.

Detailed configurations of steps S10 and S20 will be described with reference to FIGS. 10 and 11.

Figure 10:
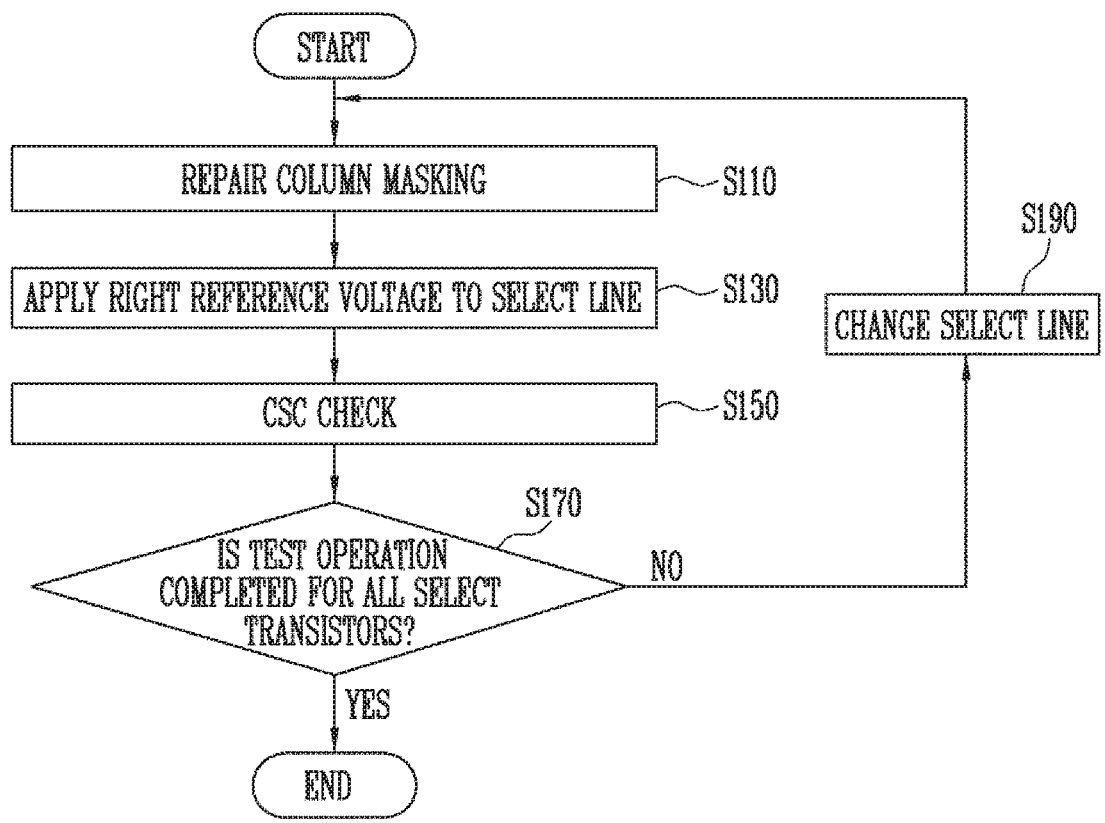
FIG. 10 is a detailed flowchart of the right test operation of FIG. 9.

FIG. 10 is a detailed flowchart of the right test operation of FIG. 9.

Referring to FIG. 10, the right test operation includes step S110 of performing a repair column masking operation on a corresponding memory block, step S130 of applying the right reference voltage to a corresponding select line, and step S150 of performing a current sensing circuit (CSC) check operation. The right reference voltage may be the first reference voltage Vref1 shown in FIG. 8A. The CSC check operation may indicate a current sensing operation using a current sensing circuit (CSC). At step S170, it is determined whether the test on all of the select transistors has been completed. If the test has been completed, the right test operation is terminated. If the test has not been completed, a target select line is changed at step S190, and steps S110 to S170 are repeated.

At step S110, the repair column masking operation is performed. Typically, there is provided in the memory block a repair region corresponding to a defective memory cell which may occur in a normal region. When a defective memory cell actually occurs, a repair cell which is a memory cell in the repair region is substituted for the defective memory cell. The repair column masking operation may mean a process of outputting data stored in the repair cell based on information about addresses of the repair cell and the defective memory cell. The repair column masking operation is well known to those with ordinary knowledge in this art; therefore, detailed descriptions thereof will be omitted.

In the case where a memory cell included in the normal region is defective, an error may occur when the right test operation is performed on the drain select transistors. To prevent such an error, the repair column masking operation may be formed on the corresponding memory block before the right test is performed.

At step S130, the right reference voltage is applied to the select line. In this case, referring to FIG. 5A, the right reference voltage may be applied to the first drain select line DSL1.

At step S150, the CSC check operation is performed. As described above, after the pass voltage is applied to the word lines and the source select transistors are turned on, a drain select transistor which is in a turned-off state may be detected through a current sensing operation. The turned-off drain select transistor may correspond to the drain select transistor having a threshold voltage (denoted with "A" in FIG. 8A) higher than the first reference voltage Vref1.

At step S170, it is determined whether the test on all of the select transistors has been completed. In the above-mentioned example, the right test has been performed on only the first row, and the right test has not yet been performed on the second row. Hence, thereafter, step S190 is performed.

At step S190, the target select line is changed from the first drain select line DSL1 to the second drain select line DSL2 and, subsequently, steps S110 to S170 are repeated. In accordance with the embodiment of FIG. 5A, as the right test on the drain select transistors coupled to the second drain select line DSL2 is completed, the right test on all of the drain select transistors is completed.

In the example of FIG. 5B in which the memory block includes the four rows, steps S110 to S170 are repeated four times.

Figure 11:
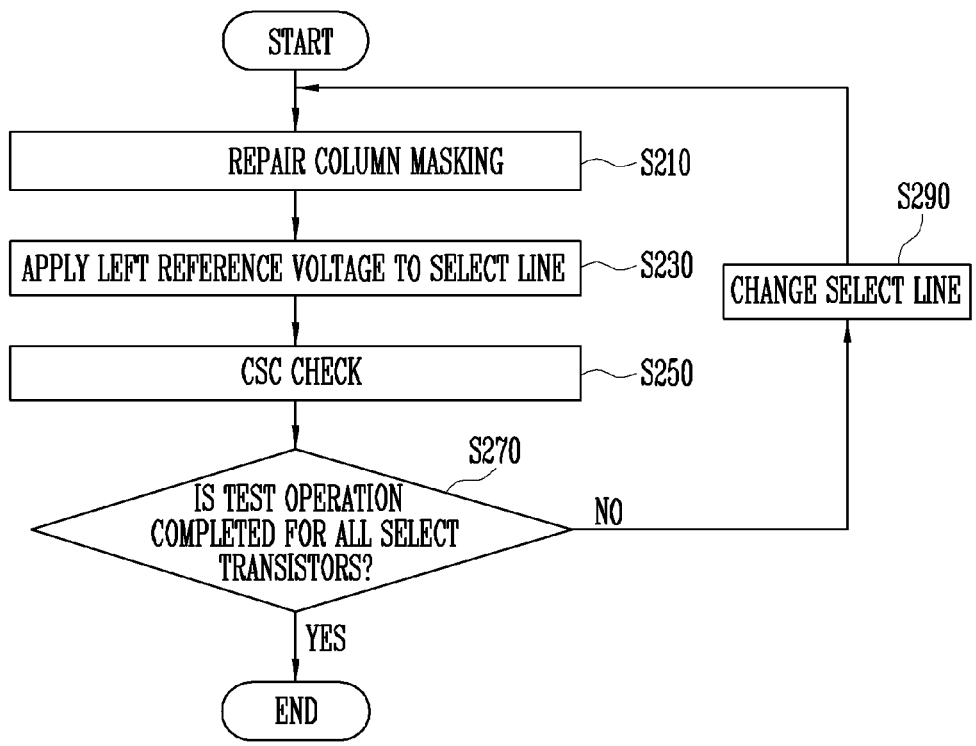
FIG. 11 is a detailed flowchart of the left test operation of FIG. 9.

FIG. 11 is a detailed flowchart of the left test operation of FIG. 9.

Referring to FIG. 11, the left test operation includes step S210 of performing a repair column masking operation on a corresponding memory block, step S230 of applying the left reference voltage to a corresponding select line, and step S250 of performing a CSC check operation. In FIG. 11, the left reference voltage may be the second reference voltage Vref2 shown in FIG. 8B. At step S270, it is determined whether the test on all of the select transistors has been completed. If the test has been completed, the left test operation is terminated. If the test has not been completed, a target select line is changed at step S290, and steps S210 to S270 are repeated.

The steps of FIG. 11 are similar to those of the right test shown in FIG. 10; therefore, repetitive explanations thereof will be omitted.

According to the method of FIGS. 9 to 11 the repair column masking operation of steps S110 and S210 is repeatedly performed each time the target select line is changed, whereby the time it takes to perform the entire test operation is increased. However, in the method of operating the semiconductor memory device according to the present disclosure, after the repair column masking operation is performed, the corresponding data is retained and the target select line is changed to perform the test operation. Therefore, repetitive repair column masking operations are omitted, whereby the operating speed of the semiconductor memory device can be enhanced substantially.

Figure 12:
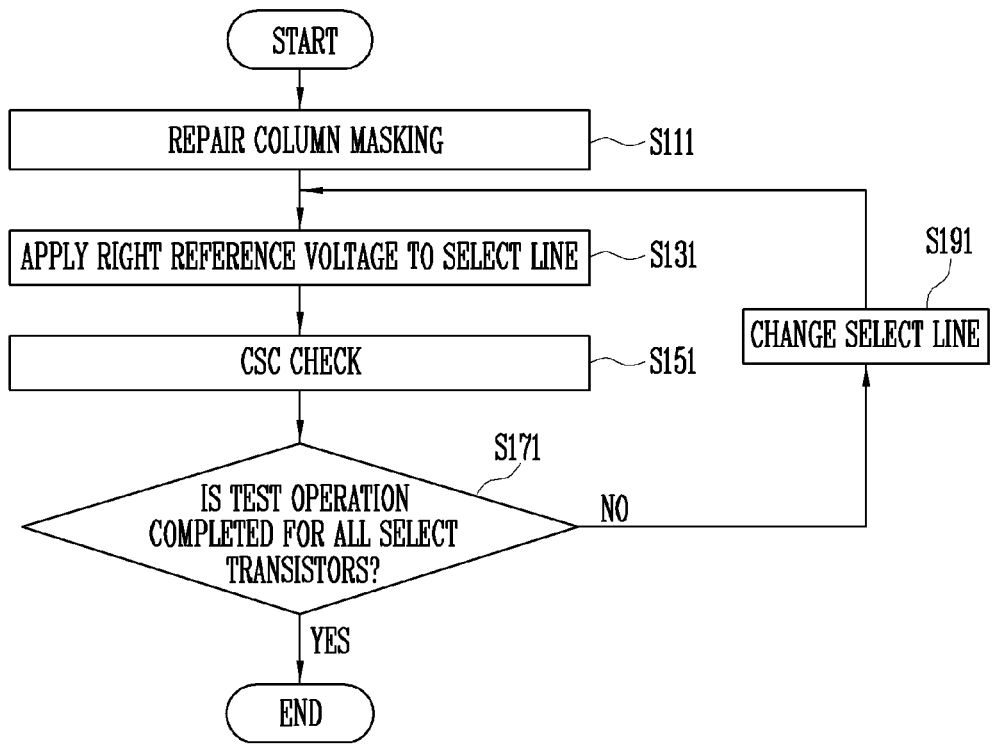
FIG. 12 is a detailed flowchart of an example of the right test operation, in accordance with an embodiment of the present disclosure.

FIG. 12 is a detailed flowchart of the right test operation, in accordance with an embodiment of the present disclosure.

Referring to FIG. 12, the right test operation includes step S111 of performing a repair column masking operation on a corresponding memory block, step S131 of applying the right reference voltage to a corresponding select line, and step S151 of performing a CSC check operation. The right reference voltage may be the first reference voltage Vref1 shown in FIG. 8A. At step S171, it is determined whether the test on all of the select transistors has been completed. If the test has been completed, the right test operation is terminated. If the test has not been completed, a target select line is changed at step S191, and steps S131 to S171 are repeated.

At step S111, the repair column masking operation is performed. Step S111 is substantially the same as that of step S110 shown in FIG. 10. Therefore, repetitive explanations will be omitted.

At step S131, the right reference voltage is applied to the select line. In this case, referring to FIG. 5A, the right reference voltage, i.e., the first reference voltage Vref1, may be applied to the first drain select line DSL1.

At step S151, the CSC check operation is performed. As described above, after the pass voltage is applied to the word lines and the source select transistors are turned on, a drain select transistor which is in a turned-off state may be determined through a current sensing operation. The turned-off drain select transistor may correspond to the drain select transistor having a threshold voltage (denoted with "A" in FIG. 8A) higher than the first reference voltage Vref1.

At step S171, it is determined whether or not the test on all of the select transistors has been completed. In the above-mentioned example, the right test has been performed on only the first row, and the right test has not yet been performed on the second row. Hence, thereafter, step S191 is performed.

At step S191, the target select line is changed from the first drain select line DSL1 to the second drain select line DSL2 and steps S131 to S171 (other than step S111) are repeated.

Unlike the right test operation shown in FIG. 10, in the right test operation according to the embodiment of the present disclosure, the repair column masking operation S111 is performed only once at the beginning. After the target drain select line is changed, the repair column masking operation S111 is not performed. Therefore, the speed of the entire first test, i.e., the entire right test operation, can be enhanced substantially.

Figure 13:
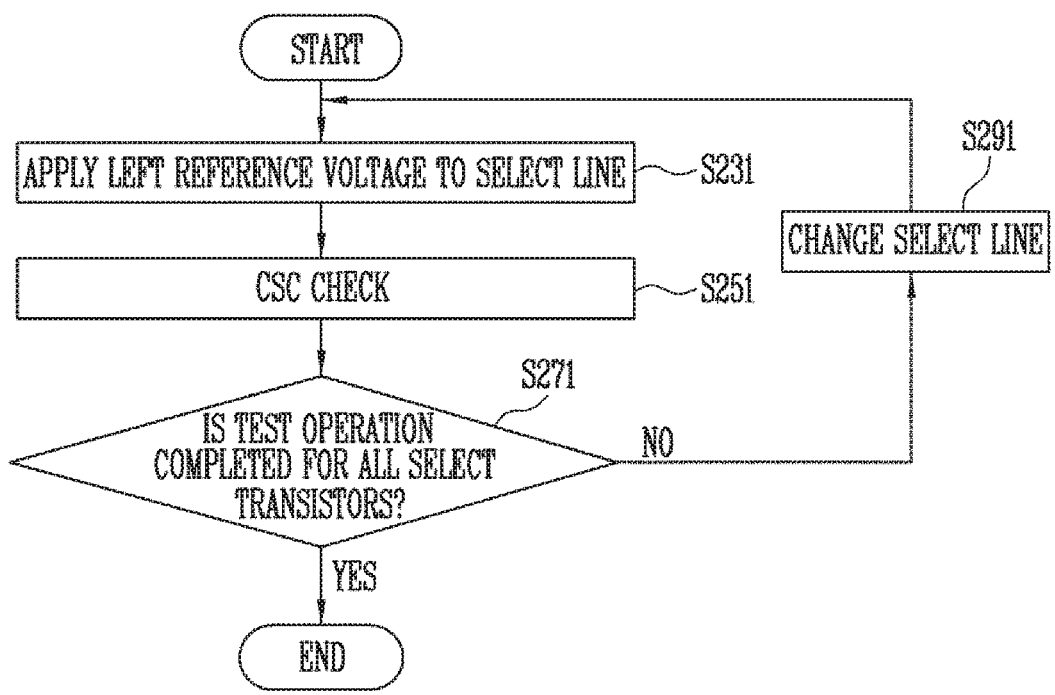
FIG. 13 is a detailed flowchart of an example of the left test operation, in accordance with an embodiment of the present disclosure.

FIG. 13 is a detailed flowchart of the left test operation in accordance with an embodiment of the present disclosure.

Referring to FIG. 13, the left test operation includes step S231 of applying the left reference voltage to a corresponding select line, and step S251 of performing a CSC check operation. In FIG. 13, the left reference voltage may be the second reference voltage Vref2 shown in FIG. 8B. At step S271, it is determined whether the test on all of the select transistors has been completed. If the test has been completed, the left test operation is terminated. If the test has not been completed, a target select line is changed, at step S291, and steps S231 to S271 are repeated.

Unlike the left test operation shown in FIG. 11, in the left test operation according to the embodiment of the present disclosure, a repair column masking operation is not performed, and the result of the repair column masking operation performed at step S111 of FIG. 12 is used. Therefore, the speed of the entire left test operation is improved.

Figure 14:
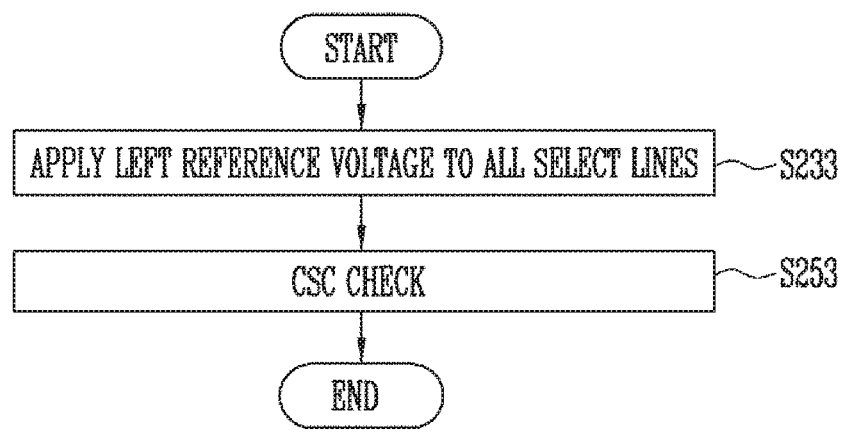
FIG. 14 is a detailed flowchart of an example of the left test operation, in accordance with an embodiment of the present disclosure.

FIG. 14 is a detailed flowchart of an example of the left test operation in accordance with an embodiment of the present disclosure.

Referring to FIG. 14, the left test operation includes step S233 of applying the left reference voltage to all of the select lines, and step S253 of performing a CSC check operation. The left test operation shown in FIG. 14 will be described in detail with reference to FIG. 15 along with FIG. 14.

Figure 15:
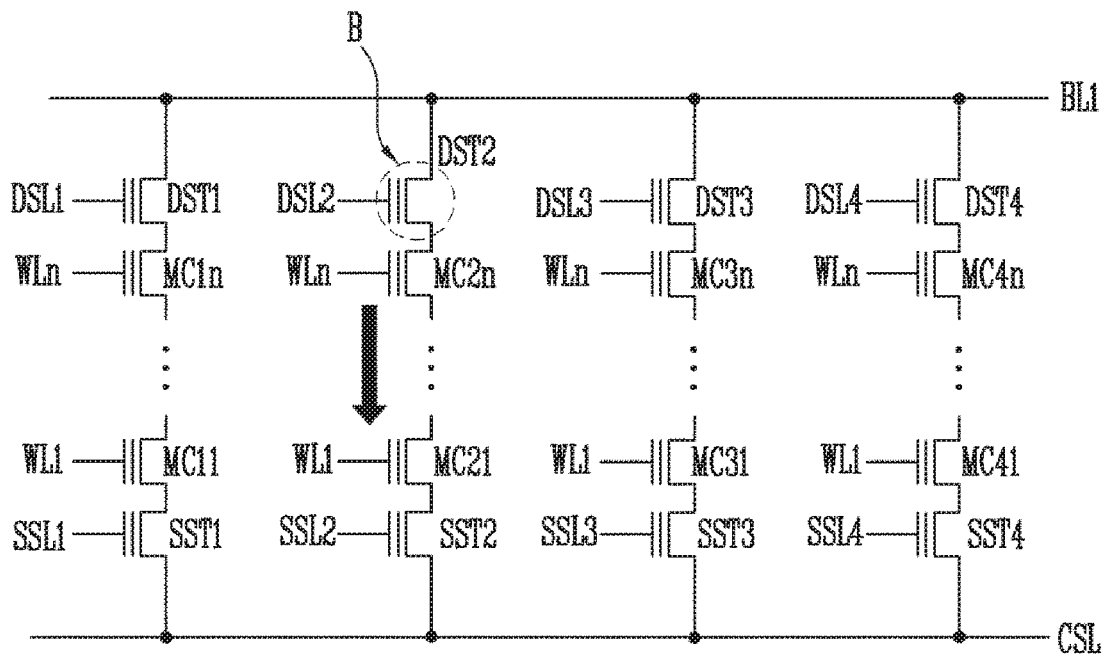
FIG. 15 is a diagram illustrating the left test operation of FIG. 14, in accordance with an embodiment of the present disclosure.

FIG. 15 is a diagram illustrating the left test operation of FIG. 14. At step S233, the left reference voltage, i.e., the second reference voltage Vref2, is applied to all drain select lines DSL1, DSL2, DSL3, and DSL4. A pass voltage is applied to all word lines WL1 to WLn, and a turn-on voltage is also applied to source select lines SSL1 to SSL4.

In the case of a normal drain select transistor, it remains turned off because the second reference voltage Vref2 is applied to a gate electrode thereof.

However, as shown in FIG. 15, in the case of a drain select transistor B that has an excessively low threshold voltage, the drain select transistor B may remain turned on and allow current to flow when the second reference voltage Vref2 is applied. Therefore, as shown in FIG. 15, in the case where the drain select transistor B that has an excessively low threshold voltage is present, the threshold voltage of at least one of the drain select transistors on the first row is excessively low. On the other hand, in the case where there is no drain select transistor that has an excessively low threshold voltage, the left test on all of the drain select transistors in the memory block may be completed by performing only the single left test operation.

Figure 16:
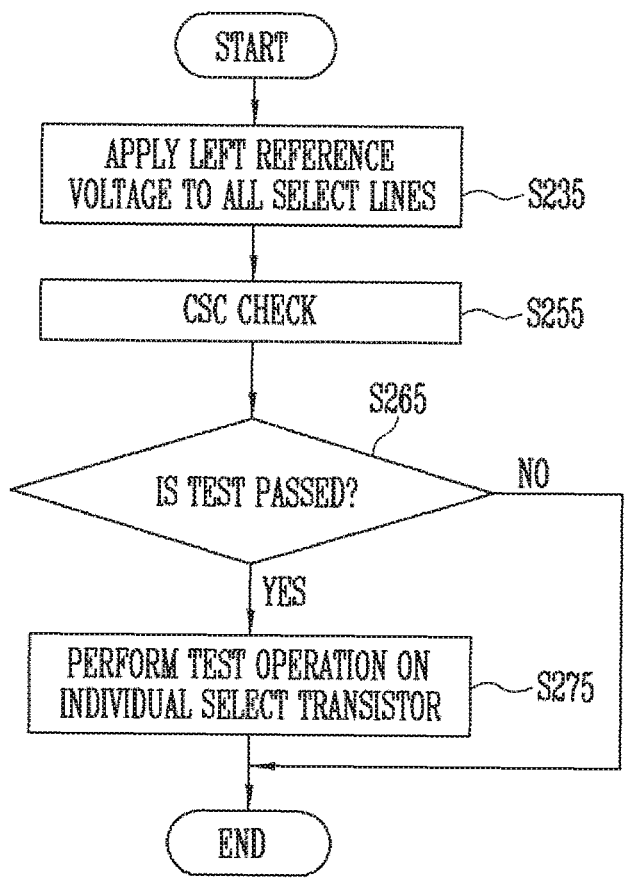
FIG. 16 is a detailed flowchart of an example of the left test operation, in accordance with an embodiment of the present disclosure.

FIG. 16 is a detailed flowchart of an example of the left test operation in accordance with an embodiment of the present disclosure.

Referring to FIG. 16, the left test operation includes step S235 of applying the left reference voltage to all of the select lines, and step S255 of performing a CSC check operation. Steps S235 and S255 are substantially the same as steps S233 and S253 of FIG. 14; therefore, repetitive explanations thereof will be omitted.

The left test operation according to this embodiment of the present disclosure further includes step S265 of determining whether the drain select transistors have passed the left test, and step S275 of performing a test operation on an individual select transistor if the drain select transistors have not passed the left test.

As described above, in the case where there is no drain select transistor that has an excessively low threshold voltage, all of the drain select transistors in the memory block may pass the left test through only the single left test operation, and the left test operation may be completed.

However, in the left test through steps S235 and 255, if a drain select transistor that has an excessively low threshold voltage is detected, a column in which the corresponding drain select transistor is included may be detected, but a row in which the corresponding drain select transistor is included may not be detected. Therefore, the row in which the detected drain select transistor is included may be detected by performing a left test on each row. Consequently, step S275 is performed through the left test operation described with reference to step S230.

Figure 17:
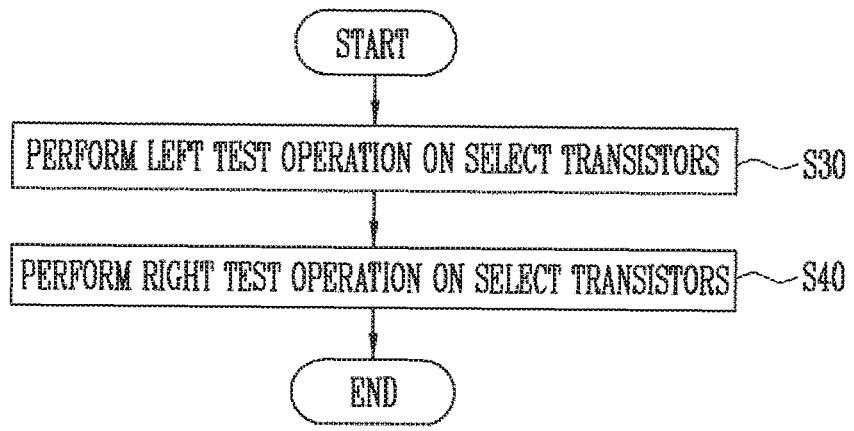
FIG. 17 is a flowchart of a method of testing select transistors, in accordance with an embodiment of the present disclosure.

FIG. 17 is a flowchart of a method of testing select transistors in accordance with an embodiment of the present disclosure.

Referring to FIG. 17, the method of testing select transistors according to this embodiment of the present disclosure includes step S30 of performing a left test operation on select transistors, and step S40 of performing a right test operation on the select transistors.

Unlike the embodiment of FIG. 9 in which the right test operation is performed as the first test on select transistors at step S10 and the left test operation is thereafter performed as the second test at step S20, in the embodiment of FIG. 17, the left test operation is performed as a first test on the select transistors at step S30, and the right test operation is thereafter performed as a second test at step S40.

It will be understood that details of step S30 of performing to the left test operation on the select transistors and step S40 of performing the right test operation are similar to those described with reference to FIGS. 12 to 16.

At step S30, the steps shown in FIG. 12 may be similarly performed. However, unlike the embodiment of FIG. 12 in which the right reference voltage is applied to a select line at step S131, the embodiment of FIG. 17 may be configured such that the left reference voltage is applied to a select line at step S30.

At step S40, the steps shown in FIG. 13 may be similarly performed. However, unlike the embodiment of FIG. 13 in which the left reference voltage is applied to a select line at step S231, the embodiment of FIG. 17 may be configured such that the right reference voltage is applied to a select line at step S40.

The steps shown in FIGS. 14 and 16 may also be performed at step S30 of FIG. 17. In other words, at step S30 of FIG. 17, it may be determined whether the drain select transistors have passed the left test by applying the left reference voltage to all of the select lines. As shown in FIG. 16, if all of the drain select transistors have passed the left test, step S30 of FIG. 17 is terminated. If all of the drain select transistors have not passed the left test, a left test operation on an individual transistor may be performed at step S275.

Figure 18:
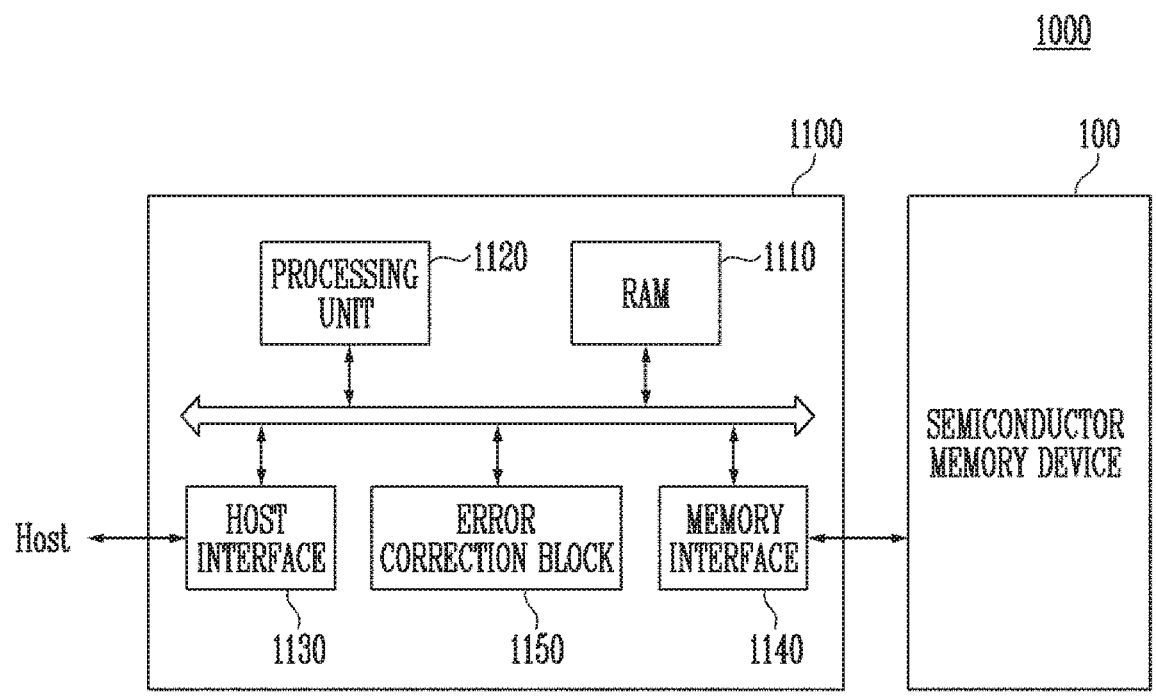
FIG. 18 is a block diagram illustrating a memory system including the semiconductor memory device of FIG. 1, in accordance with an embodiment of the present disclosure.

FIG. 18 is a block diagram illustrating a memory system 1000 including the semiconductor memory device 100 of FIG. 1.

Referring to FIG. 18, the memory system 1000 may include a semiconductor memory device 100 and a controller 1100. The semiconductor memory device 100 may have the same configuration and operation as those of the semiconductor memory device described with reference to FIG. 1. Hereinafter, repetitive explanations will be omitted.

The controller 1100 may be coupled to a host Host and the semiconductor memory device 100. The controller 1100 is configured to access the semiconductor memory device 100 in response to a request from the host Host. For example, the controller 1100 may control a read operation, a write operation, an erase operation, and a background operation of the semiconductor memory device 100. The controller 1100 may provide an interface between the host Host and the semiconductor memory device 100. The controller 1100 is configured to drive firmware for controlling the semiconductor memory device 100.

The controller 1100 may include a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 may include a protocol for performing data exchange between the host Host and the controller 1100. In an embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 may interface with the semiconductor memory device 100. For example, the memory interface may include a NAND interface or a NOR interface.

The error correcting block 1150 may use an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an exemplary embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to may form a memory card. For example, the controller 1100 and the semiconductor memory device 100 may be integrated into a single semiconductor device and may form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), and a universal flash storage (UFS).

The controller 1100 and the semiconductor memory device 100 may be integrated into a single semiconductor device to may form a solid state drive (SSD). The SSD may include a storage device configured to store data to a semiconductor memory. When the memory system 1000 is used as the SSD, the operating speed of the host Host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 19:
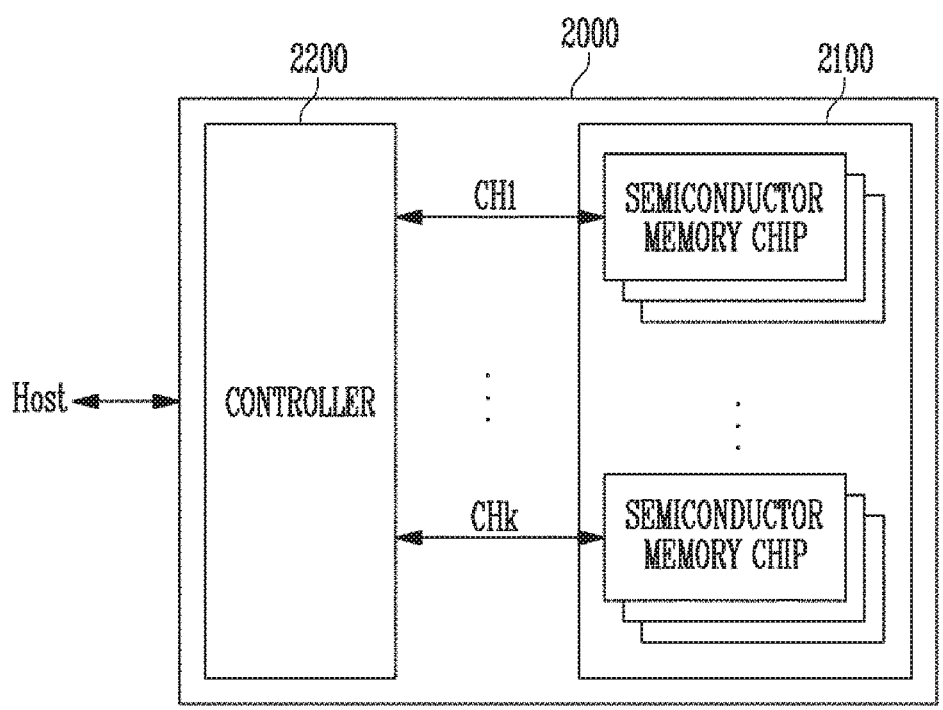
FIG. 19 is a block diagram illustrating an example of application of the memory system of FIG. 18, in accordance with an embodiment of the present disclosure.

FIG. 19 is a block diagram illustrating an example of application of the memory system 2000 of FIG. 18.

Referring to FIG. 19, the memory system 2000 may include a semiconductor memory device 2100 and a controller 2200. The semiconductor memory device 2100 may include a plurality of semiconductor memory chips. The semiconductor memory chips are divided into a plurality of groups.

In FIG. 19, it is illustrated that the respective groups communicate with the controller 2200 through first to k-th channels CH1 to CHk. Each semiconductor memory chip may have the same configuration and operation as those of an embodiment of the semiconductor memory device 100 described with reference to FIG. 1.

Each group may communicate with the controller 2200 through one common channel. The controller 2200 has the same configuration as that of the controller 1100 described with reference to FIG. 18 and is configured to control a plurality of memory chips of the semiconductor memory device 2100 through the plurality of channels CH1 to CHk.

Figure 20:
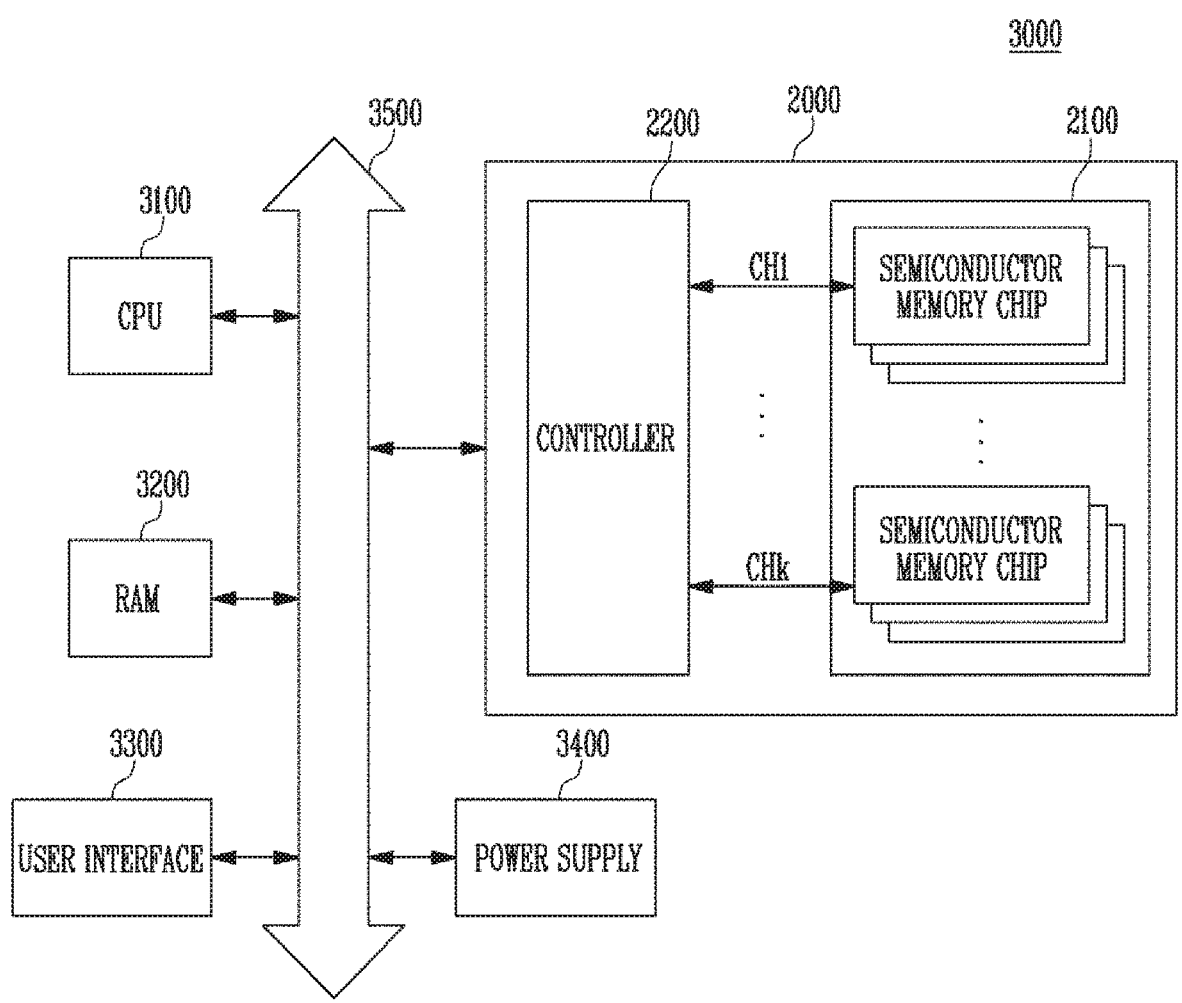
FIG. 20 is a block diagram illustrating a computing system including the memory system illustrated with reference to FIG. 19, in accordance with an embodiment of the present disclosure.

FIG. 20 is a block diagram illustrating a computing system 3000 including the memory system 2000 illustrated with reference to FIG. 19.

The computing system 3000 may include a central processing unit (CPU) 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 20, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 20, the memory system 2000 described with reference to FIG. 19 is illustrated as being used. In an embodiment, the memory system 1000 described with reference to FIG. 18 may be replaced with the memory system 2000. In an embodiment, the computing system 3000 may include all of the memory systems 1000 and 2000 described with reference to FIGS. 19 and 18.

Various embodiments of the present disclosure may provide a semiconductor memory device having an improved operating speed.

Various embodiments of the present disclosure may provide a method of operating a semiconductor memory device at an improved speed.

In detail, in accordance with embodiments of the present disclosure, tests of select transistors may be successively performed with a result of a repair column masking operation, so that the repair column masking operation can be prevented from being repeatedly performed, whereby the operating speed of the semiconductor memory device may be improved. Furthermore, when a left test operation is performed on the select transistors, it may be determined whether there is a defective select transistor by only a single left test operation. Consequently, a test operating speed of the semiconductor memory device can be enhanced substantially.

Examples of embodiments of the present invention have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in may form and details may be made without departing from the spirit and scope of the present disclosure as set forth in the following claims.

What is claimed is:

1. A method for operating a semiconductor memory device, the method comprising:
   performing a repair column masking operation of a selected memory region;
   testing a threshold voltage distribution of first drain select transistors of the selected memory region; and
   testing a threshold voltage distribution of second drain select transistors included in the selected memory region.

2. The method according to claim 1, wherein the first drain select transistors are coupled with a first drain select line to form a first row, and the second drain select transistors are coupled with a second drain select line to form a second row.

3. The method according to claim 2, wherein the testing of the threshold voltage distribution of the first drain select transistors includes performing a first test operation on the first drain select transistors comprising:
   applying a right reference voltage to the first drain select line; and
   determining drain select transistors each having a threshold voltage higher than the right reference voltage among the first drain select transistors by performing a current sensing circuit (CSC) check operation.

4. The method according to claim 3, wherein the testing of the threshold voltage distribution of the second drain select transistors includes the performing of the first test operation on the second drain select transistors comprising:
applying the right reference voltage to the second drain select line; and
determining drain select transistors each having a threshold voltage higher than the right reference voltage among the second drain select transistors by performing the CSC check operation.

5. The method according to claim 4, further comprising: performing a second test operation on the first drain select transistors and on the second drain select transistors.

6. The method according to claim 5, wherein the performing of the second test operation on the first drain select transistors comprises:
applying a left reference voltage to the first drain select line; and
determining drain select transistors each having a threshold voltage lower than the left reference voltage among the first drain select transistors by performing the CSC check operation.

7. The method according to claim 6, wherein the performing of the second test operation on the second drain select transistors comprises:
applying the left reference voltage to the second drain select line; and
determining drain select transistors each having a threshold voltage lower than the left reference voltage among the second drain select transistors by performing the CSC check operation.

8. The method according to claim 4, further comprising performing a second test operation on the first and the second drain select transistors.

9. The method according to claim 8, wherein the performing of the second test operation on the first and the second drain select transistors comprises:
applying a left reference voltage to the first drain select line and the second drain select line; and
determining whether a drain select transistor having a threshold voltage lower than the left reference voltage is present among the first drain select transistors and the second drain select transistors by performing the CSC check operation.

10. The method according to claim 9, further comprising, when a drain select transistor having a threshold voltage lower than the left reference voltage is present among the first drain select transistors and the second drain select transistors:
applying the left reference voltage to the first drain select line;
determining drain select transistors each having a threshold voltage lower than the left reference voltage among the first drain select transistors by performing the CSC check operation;
applying the left reference voltage to the second drain select line; and
determining drain select transistors each having a threshold voltage lower than the left reference voltage among the second drain select transistors by performing the CSC check operation.

11. A method for operating a semiconductor memory device, comprising:
performing a repair column masking operation of a selected memory block;
performing a first test operation on a plurality of drain select transistors included in the selected memory block; and
performing a second test operation on the plurality of drain select transistors.

12. The method according to claim 11, wherein the performing of the first test operation on the plurality of drain select transistors included in the selected memory block comprises:
performing the first test operation on a first drain select transistor among the plurality of drain select transistors; and
performing the first test operation on a second drain select transistor among the plurality of drain select transistors.

13. The method according to claim 11, wherein the performing of the first test operation on the plurality of drain select transistors included in the selected memory block comprises:
applying a left reference voltage to drain select lines coupled with the plurality of drain select transistors; and
determining whether a drain select transistor having a threshold voltage lower than the left reference voltage is present among the plurality of drain select transistors by performing a current sensing circuit (CSC) check operation.

14. A semiconductor memory device comprising:
a memory cell array including a plurality of memory blocks;
a peripheral circuit configured to perform a read operation on the memory cell array; and
a control logic configured to control an operation of the peripheral circuit,
wherein the control logic controls the peripheral circuit to perform a repair column masking operation on a selected memory block of the plurality of memory blocks, perform a first test operation on first drain select transistors included in the selected memory block, and perform the first test operation on second drain select transistors different from the first drain select transistors.

15. The semiconductor memory device according to claim 14, wherein the first drain select transistors are coupled with a first drain select line to form a first row, and the second drain select transistors are coupled with a second drain select line to form a second row.

16. The semiconductor memory device according to claim 15, wherein the control logic controls the peripheral circuit to apply a right reference voltage to the first drain select line, and perform the first test operation on the first drain select transistors by determining drain select transistors each having a threshold voltage higher than the right reference voltage among the first drain select transistors by performing a current sensing circuit (CSC) check operation.

17. The semiconductor memory device according to claim 16, wherein the control logic controls the peripheral circuit to apply the right reference voltage to the second drain select line, and perform the first test operation on the second drain select transistors by determining drain select transistors each having a threshold voltage higher than the right reference voltage among the second drain select transistors by performing the CSC check operation.

18. The semiconductor memory device according to claim 17, wherein the control logic controls the peripheral circuit to perform a second test operation on the first drain select transistors, and perform the second test operation on the second drain select transistors.

19. The semiconductor memory device according to claim 18, wherein the control logic controls the peripheral circuit to apply a left reference voltage to the first drain select line, and perform the second test operation on the first drain select transistors by determining drain select transistors each having a threshold voltage lower than the left reference voltage among the first drain select transistors by performing the CSC check operation.

20. The semiconductor memory device according to claim 19, wherein the control logic controls the peripheral circuit to apply the left reference voltage to the second drain select line, and perform the second test operation on the second drain select transistors by determining drain select transistors each having a threshold voltage lower than the left reference voltage among the second drain select transistors by performing the CSC check operation.

* * * * *